(12) United States Patent
Watanabe

(10) Patent No.: US 6,458,682 B2
(45) Date of Patent: Oct. 1, 2002

(54) METHOD OF MANUFACTURING A BUMP ELECTRODE SEMICONDUCTOR DEVICE USING PHOTOSENSITIVE RESIN

(75) Inventor: Kiyonori Watanabe, Tokyo (JP)

(73) Assignee: Oki Electric Industry Co, Ltd., Tokyo (JP)

( * ) Notice: Subject to any disclaimer, the term of this patent is extended or adjusted under 35 U.S.C. 154(b) by 0 days.

(21) Appl. No.: 09/794,621

(22) Filed: Feb. 28, 2001

(30) Foreign Application Priority Data

Mar. 8, 2000 (JP) .................................. 2000-068630

(51) Int. Cl.$^7$ .............................................. H01L 21/44
(52) U.S. Cl. ...................... 438/612; 438/613; 438/614
(58) Field of Search ............................... 438/612, 613, 438/614

(56) References Cited

U.S. PATENT DOCUMENTS

| | | | | |
|---|---|---|---|---|
| 5,171,711 A | * | 12/1992 | Tobimatsu | 438/612 |
| 5,877,078 A | * | 3/1999 | Yanagida | 438/612 |
| 5,960,308 A | * | 9/1999 | Akagawa et al. | 438/613 |
| 2001/0008310 A1 | * | 7/2001 | Sakuyama et al. | 257/737 |
| 2001/0026021 A1 | * | 10/2001 | Honda | 257/778 |

FOREIGN PATENT DOCUMENTS

| | | | | |
|---|---|---|---|---|
| JP | 40109315 A | * | 4/1989 | 438/FOR 343 |
| JP | 40212562 A | * | 5/1990 | 438/FOR 343 |
| JP | 402198814 A | * | 8/1990 | 438/FOR 343 |
| JP | 403073535 A | * | 3/1991 | 438/FOR 343 |
| JP | 403101234 A | * | 4/1991 | 438/FOR 343 |

\* cited by examiner

Primary Examiner—John F. Niebling
Assistant Examiner—Lynne A Gurley
(74) Attorney, Agent, or Firm—Rabin & Berdo, P.C.

(57) ABSTRACT

An electrode pad, a surface protection film, an inter-layer insulation film, an undercoat metal layer, and a rewiring layer are formed in that order on top of an insulation film formed on a wafer. A liquid photosensitive resin film and a solid photosensitive resin film, having negative photosensitive property, respectively, are sequentially formed across the entire surface of the wafer. The liquid photosensitive resin film is made of a resin having weaker adhesion with the undercoat metal layer than that of a resin for the solid photosensitive resin film. The liquid photosensitive resin film and the solid photosensitive resin film are subjected to exposure and development, thereby forming an opening for forming a bump electrode therein, and the bump electrode is formed inside the opening for forming the bump electrode. Practically at the same time when the liquid photosensitive resin film is removed by use of a removing solvent, the solid photosensitive resin film is peeled off and removed. Then, as no portion of the liquid photosensitive resin film and the solid photosensitive resin film is left out, unwanted portions of the undercoat metal layer can be removed with certainty.

17 Claims, 6 Drawing Sheets

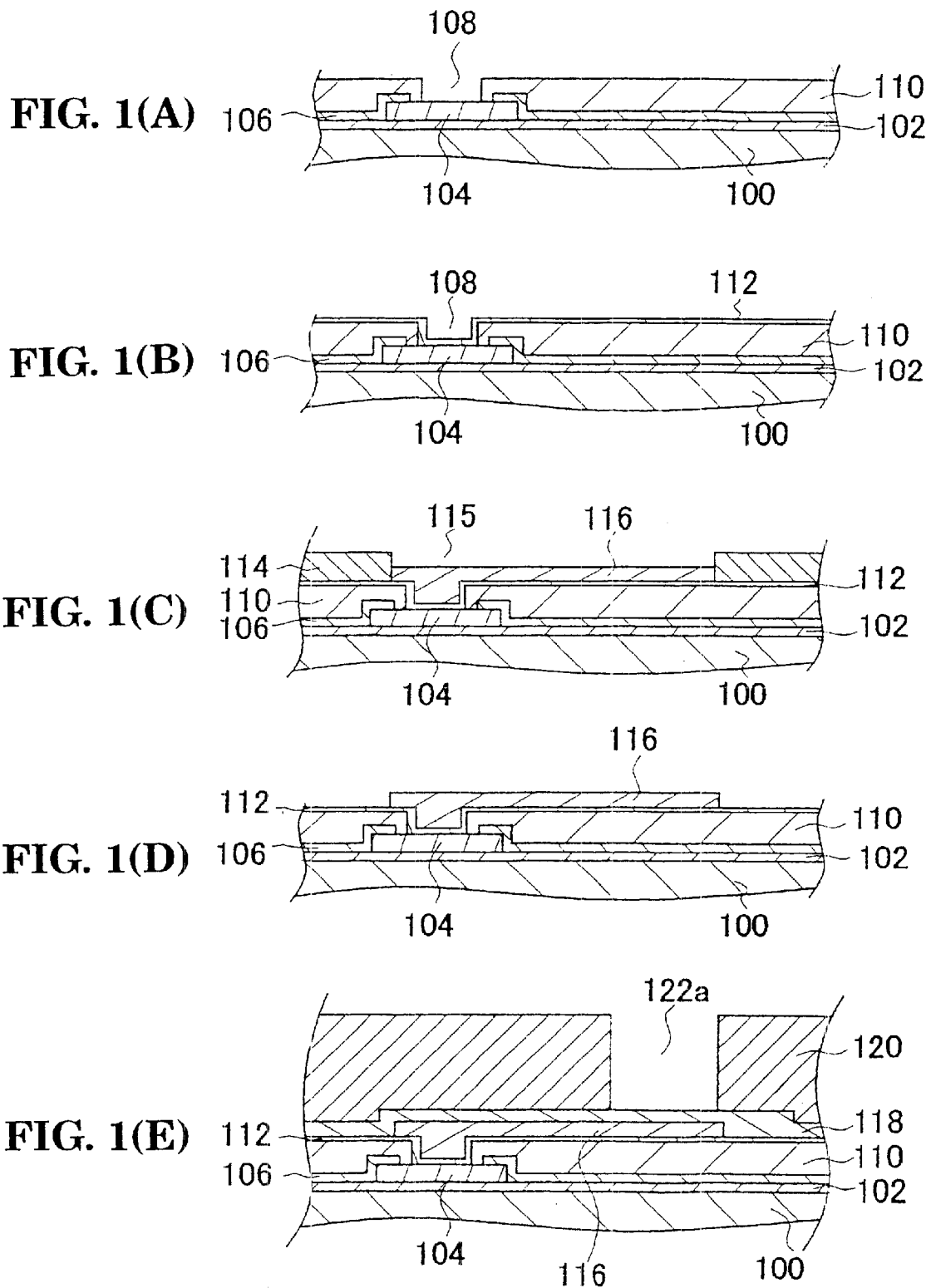

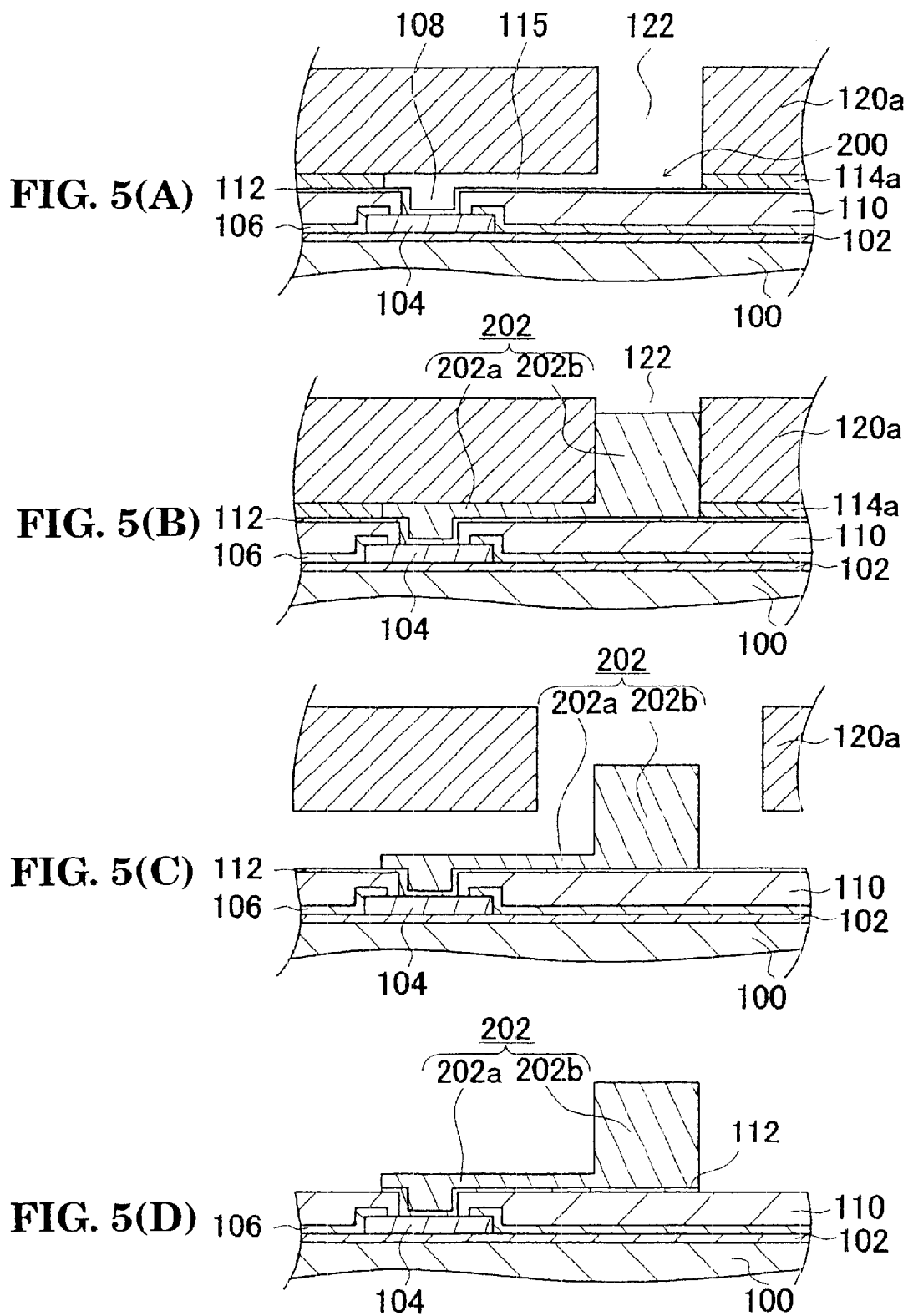

METHOD OF MANUFACTURING A BUMP ELECTRODE SEMICONDUCTOR DEVICE USING PHOTOSENSITIVE RESIN

BACKGROUND OF THE INVENTION

1. Field of the Invention

The present invention is related to a method of manufacturing a semiconductor device, and in particular, to a method of manufacturing a semiconductor device provided with bump electrodes (protruded electrodes) to be mounted on a wafer level chip size package (W - CSP), a tape carrier package (TCP), a chip on board (COB), and so forth. This application is a counterpart application of Japanese Application Serial Number 68630/2000, filed Mar. 8, 2000, the subject matter of which is incorporated herein by reference.

2. Description of the Related Art

As a structure for mounting a semiconductor IC chip (referred to hereinafter merely as "chip") on a connecting board, a wafer level chip size package, a tape carrier package, a chip on board, and so forth have so far been proposed. With the structure for mounting the semiconductor IC chip, respective semiconductor components formed in the chip are electrically connected with the connecting board via respective bump electrodes. A structure of the respective bump electrodes is formed by respective steps described as follows.

First, as shown in FIG. 6(A), a metal pad 14 is formed on top of an oxide film 12 formed on a semiconductor (Si) wafer (referred to hereinafter merely as "wafer") 10. Further, a surface protection film 16 and an inter-layer insulation film 18 are formed in that order across the surface of the wafer 10. Thereafteer, a thru-hole is opened over the metal pad 14. Subsequently, an undercoat metal layer 20 is formed across the surface of the wafer 10. Further, a rewiring layer 22 is formed so as to cover a region of the undercoat metal layer 20, extending from the thru-hole over the metal pad 14 to a location where a bump electrode 28 as described later on is to be formed.

Subsequently, as shown in FIG. 6(B), a solid photosensitive resin film 24 is stuck onto the surface of the wafer 10. Owing to a reason from the standpoint of carrying out a film-forming process, a face having microscopic asperities instead of a planar face is formed on the surface of the undercoat metal layer 20 to which the solid photosensitive resin film 24 is stuck.

Accordingly, a resin having high adhesion with the undercoat metal layer 20 is adopted for the solid photosensitive resin film 24. Further, after sticking the solid photosensitive resin film 24 to the undercoat metal layer 20, heat and pressure are applied to the solid photosensitive resin film 24, thereby causing the solid photosensitive resin film 24 to adhere to the surfaces of the undercoat metal layer 20, and rewiring layer 22: Thereafter, the solid photosensitive resin film 24 is subjected to exposure and development, thereby forming an opening 26 for forming the bump electrode. In a next step, the bump electrode 28 made of a metal such as solder (Pb—Sb alloy), or the like is formed inside the opening 26 for forming the bump electrode. Then, as shown in FIG. 6(C), remaining portions of the solid photosensitive resin film 24 are removed, and further, portions of the undercoat metal layer 20, not covered by the wiring layer 22, are removed, thereby forming a structure of the bump electrode 28.

According to the conventional technology described above, however, the solid photosensitive resin film 24 is caused to adhere to the surface of the undercoat metal layer 20 as shown in FIG. 6(B). At this point in time, the solid photosensitive resin film 24 is stuck to the face having the microscopic asperities as well, formed on the surface of the undercoat metal layer 20. In particular, it is hard to remove portions of the solid photosensitive resin film 24, stuck to depressed parts of the face.

Furthermore, as described above, since a constituent material having high adhesion with the undercoat metal layer 20 is adopted for the solid photosensitive resin film 24, there occur cases where the portions of the solid photosensitive resin film 24, stuck to the depressed parts of the face of the undercoat metal layer 20, are left intact even after carrying out removal of the solid photosensitive resin film 24.

Accordingly, it has been highly hoped that unwanted portions of the undercoat metal layer 20 is removed with ease, so that faulty insulation due to presence of remaining portions of the undercoat metal layer 20 can be prevented, resulting in enhanced reliability of a semiconductor device.

SUMMARY OF THE INVENTION

It is therefore an object of the invention to provide a method of manufacturing a semiconductor device, whereby occurrence of faulty insulation can be checked, resulting, in enhancement of reliability of the semiconductor device.

To this end, a method of manufacturing a semiconductor device according to one embodiment of the invention comprises forming an electrode pad on top of an insulation film formed on a semiconductor substrate, forming an undercoat electrically conductive layer electrically connected with the electrode pad on top of the insulation film and the electrode pad, forming a wiring layer for electrically connecting the electrode pad with an bump electrode via the undercoat electrically conductive layer over a region of the undercoat electrically conductive layer, extending from a portion thereof, over the electrode pad, to a portion thereof, at a location where the bump electrode is to be formed, forming a first photosensitive resin film on top of the undercoat electrically conductive layer and the wiring layer, forming a second photosensitive resin film on top of the first photosensitive resin film, subjecting the first photosensitive resin film a and the second photosensitive resin film to exposure and development, and forming an opening for forming the bump electrode in a portion of the wiring layer, at the location where the bump electrode is to be formed, so as to expose the portion of the wiring layer, forming the bump electrode electrically connected with the wiring layer inside the opening for forming the bump electrode, removing the first photosensitive resin film and the second photosensitive resin film after the formation of the bump electrode, and removing portions of the undercoat electrically conductive layer, not covered by the wiring layer, after the removal of the f first photosensitive resin film and the second photosensitive resin film, wherein the first photosensitive resin film and the second photosensitive resin film are made of a resin having negative photosensitive property, respectively, and the first photosensitive resin film is made of the resin having weaker adhesion with the undercoat electrically conductive layer than that of the resin for the second photosensitive resin film.

BRIEF DESCRIPTION OF THE DRAWINGS

FIGS. 1(A)–1(E) are schematic sectional views of a wafer showing steps of forming a bump electrode in carrying out a first embodiment of a method of manufacturing a semiconductor device according to the invention;

FIGS. 5(A)–5(D) are schematic sectional views of a wafer showing steps of forming a bump electrode in carrying out a fourth embodiment of a method of manufacturing a semiconductor device according to the invention.

DETAILED DESCRIPTION OF THE PREFERRED EMBODIMENTS

Figure 2A:
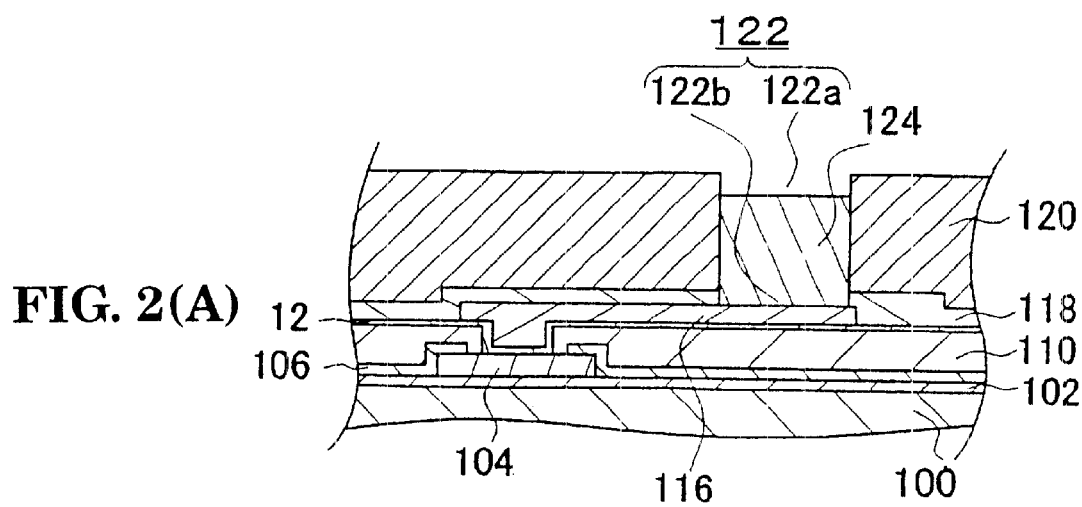
FIGS. 2(F)–2(D) are schematic sectional views of the wafer showing further steps of forming the bump electrode in carrying out the first embodiment of the invention.

Preferred embodiments of a method of manufacturing a semiconductor device according to the invention is described in detail hereinafter with reference to the accompanying drawings. In the respective embodiments described hereinafter, constituents thereof having similar function and constitution are denoted by like reference numerals, and duplicated description thereof is omitted.

First Embodiment

This embodiment of the invention is characterized in that adhesion of an undercoat metal layer 112 directly to a second solid photosensitive resin film 120 is prevented by interposing a liquid photosensitive resin film 118 therebetween. The present embodiment of the invention is described hereinafter with reference to FIGS. 1 and 2.

First, as shown in FIG. 1(A), a metal electrode pad 104 is formed on top of an oxide film 102 formed on a wafer 100. The oxide film 102 is made of an insulating material, for example, $SiO_2$. Further, in forming the metal electrode pad 104, a metal layer formed on top of the oxide film 102 by means of, for example, sputtering is patterned by etching thereof In this specification, etching refers to either wet etching or dry etching. The metal electrode pad 104 is made of an electrically conductive material, for example, Al, Al—Si alloy, Cu, or the like, and is electrically connected with semiconductor components (not shown) formed in the wafer 100.

Subsequently, a surface protection film 106 is formed across the surface of the wafer 100. The surface protection film 106 is formed by, for example, the CVD method, and is made of an insulating material, for example, $SiO_2$, $Si_3N_4$,, or the like. Thereafter, portions of the oxide film 102 and surface protection film 106, formed over the metal electrode pad 104 is removed by etching, thereby opening a thru-hole 108 over the metal electrode pad 104. Subsequently, an inter-layer insulation film 110 is formed across the surface of the wafer 100. The inter-layer insulation film 110 is made of, for example, polyimide resin. Then, a portion of the inter-layer insulation film 110, over the metal electrode pad 104, are removed by etching, opening again the thru-hole 108 over the metal electrode pad 104.

Subsequently, as shown in FIG. 1(B), an undercoat metal layer (undercoat electrically conductive layer) 112 is formed across the surface of the wafer 100. The undercoat metal layer 112 is formed by, for example, the sputtering method whereby a plurality of metal layers are deposited in sequence. Further, the undercoat metal layer 112 is formed by depositing, for example, a Ti layer and a Cu layer, a Cr layer and a Cu layer, a Cr layer, a Cu layer, and an Au layer, a Ti layer and an Au layer, a Ti layer and a Pt layer, a Ti layer and a Pd layer, a Ti—W alloy layer and an Au layer, and a Ti—W alloy layer and a Pd layer, in sequence from the side of the inter-layer insulation film 110.

Subsequently, as shown in FIG. 1(C), a first solid photosensitive resin film 114 is stuck onto the entire surface of the wafer 100. The first solid photosensitive resin film 114 is, for example, substantially in a sheet-like shape, and is made of a resin of an acrylic resin series. Further, after the first solid photosensitive resin film 114 is stuck as described above, heat and pressure are applied thereto so as to cause the same to sufficiently adhere to the surface of the undercoat metal layer 112. Thereafter, the first solid photosensitive resin film 114 is subjected to exposure and development so as to be formed into a predetermined pattern. As a result of such exposure and development as applied, an opening 115 for forming a rewiring layer is formed in a region of the first solid photosensitive resin film 114, extending from a predetermined portion thereof, over the metal electrode pad 104, including the thru-hole 108, to a portion thereof, at a location where a bump electrode 124 as described later on is to be formed.

Subsequently, a rewiring layer (wiring layer) 116 is formed inside the opening 115 for forming the rewiring layer, that is, on top of an exposed portion of the undercoat metal layer 112. The rewiring layer 116 is formed in order to route an electrode position from the metal electrode pad 104 to the portion of the first solid photosensitive resin film 114, at the location where the bump electrode 124 as described later on is to be formed. Further, the rewiring layer 116 is formed by means of electroplating using the undercoat metal layer 112 as a common electrode on one side, and is made up of, for example, Cu, Au, or solder, preferably Cu. Then, as shown in FIG. 1(D), the first solid photosensitive resin film 114 is removed by use of a removing solvent, for example, a diethylene glycol monobutyl ether solvent, a potassium hydroxide drug, or the like. Such respective steps as described above are the same as those according to the conventional techniques.

Subsequently, steps featuring this embodiment of the invention are started. More specifically, as shown in FIG. 1(E), a liquid photosensitive resin is applied across the surface of the wafer 100 by, for example, the spin coater method, and further, heat is applied thereto, thereby forming the liquid photosensitive resin film (a first photosensitive resin film) 118 according to this embodiment. The liquid photosensitive resin film 118 is made of, for example, an ethyl Cellsolve acetate resin. Accordingly, the liquid photosensitive resin film 118 has the same negative photosensitive property as that for the second solid photosensitive resin film (a second photosensitive resin film) 120, which will be described later on. Further, the liquid photosensitive resin film 118 has lower adhesion with the undercoat metal layer 112 and the rewiring layer 116 than that of the second solid photosensitive resin film 120. Furthermore, the liquid photosensitive resin film 118 has greater elasticity than that of the second solid photosensitive resin film 120.

In addition, the liquid photosensitive resin film 118 is set to have a thickness thicker than that of, for example, the rewiring layer 116. Accordingly, in the case of the rewiring layer 116 having a thickness of, for example, 5 $\mu$m, the liquid photosensitive resin film 118 is set to have a thickness not less than 5 μm. The liquid photosensitive resin film 118 has such elasticity as described above, and is excellent in expansion and contraction property. Accordingly, when the second solid photosensitive resin film 120 is stuck thereto, the liquid photosensitive resin film 118 undergoes contraction at a portion thereof, in contact with the rewiring layer 116 projected from the surface of the undercoat metal layer 112, thereby filling up the difference in level between the portion thereof over the rewiring layer 116, and portions thereof on the periphery of the rewiring layer 116, over the undercoat metal layer 112. Consequently, the second solid photosensitive resin film 120 stuck onto the liquid photosensitive resin film 118 becomes insusceptible to deformation on the periphery of the rewiring layer 116, so that the second solid photosensitive resin film 120 can be maintained in a predetermined shape. As a result, positioning of the bump electrode 124 as described later on can be executed with accuracy.

After, preferably immediately after applying the liquid photosensitive resin 118 according to the present embodiment, the second solid photosensitive resin film 120 is stuck to the entire surface of the wafer 100, that is, onto the liquid photosensitive resin film 118. The second solid photosensitive resin film 120 is made of, for example, the same kind of resin of the acrylic resin series as that used for the first solid photosensitive resin film 114. Further, as with the case of the first solid photosensitive resin film 114, after the second solid photosensitive resin film 120 is stuck to the liquid photosensitive resin film 118, heat and pressure are applied thereto, thereby causing the second solid photosensitive resin film 120 to sufficiently adhere to the surface of the liquid photosensitive resin film 118. With such a constitution as described in the foregoing, there will not occur direct adhesion of the second solid photosensitive resin film 120 to the, undercoat metal layer 112.

Further, as described above, the liquid photosensitive resin film 118 has weaker adhesion with the undercoat metal layer 112 and the rewiring layer 116 than that of the second solid photosensitive resin film 120, and can be removed with ease. Consequently, the liquid photosensitive resin film 118 can be removed with certainty, and portions of the second solid photosensitive resin film 120 can be prevented from adhering to the undercoat metal layer 112 with the result that the portions thereof are left out. As a result, at the time of etching as described later on, unwanted portions of the undercoat metal layer 112 can be removed with certainty, thereby enabling electrical characteristics and reliablity of a semiconductor device to be enhanced.

After sticking of the second solid photosensitive resin film 120 as above, the second solid photosensitive resin film 120 is subjected to exposure and development so as to be formed into a predetermined pattern. As a result of such exposure and development as described, an upper opening 122a for forming the bump electrode is formed in a portion of the second solid photosensitive resin film 120, over a portion of the rewiring layer 116, corresponding to a location where the bump electrode 124 is to be formed. At this point in time, by adjusting a wavelength of exposure light, exposure time, and development time, the upper opening 122a for forming the bump electrode is selectively formed in the second solid photosensitive resin film 120, thereby exposing a portion of the upper face of the liquid photosensitive resin film 118. Accordingly, when forming the upper opening 122a in the second solid photosensitive resin film 120, no opening is formed in the liquid photosensitive resin film 118.

Subsequently, as shown in FIG. 2(A), by subjecting the liquid photosensitive resin film 118 to exposure and development, a lower opening 122b for forming the bump electrode is selectively formed in the liquid photosensitive resin film 118, thereby exposing a portion of the upper face of the rewiring layer 116. The lower opening 122b for forming the bump electrode is formed practically at the same location as that for the upper opening 122a for forming the bump electrode. Further, an internal diameter (a width in section) of the lower opening 122b for forming the bump electrode is set so as to be practically identical to an internal diameter (a width in section) of the upper opening 122a for forming the bump electrode. With such a constitution as described above, after the upper opening 122a for forming the bump electrode is formed in the second solid photosensitive resin film 120, the lower opening 122b for forming the bump electrode is subsequently formed in the liquid photosensitive resin film 118. Further, the upper and lower openings 122a, 122b, for forming the bump electrode, respectively, are formed practically at the same location, and have the same internal diameter. Consequently, the bump electrode 124 formed inside the upper and lower openings 122a, 122b (122) for forming the bump electrode, can have practically the same outer diameter thicknesswise. As a result, it is very unlikely that the outer diameter of a portion of the bump electrode 124, connected with the undercoat metal layer 112, becomes narrower than that of other portions thereof, so that a rise in electrical resistance at the portion of the bump electrode 124, for connection, which otherwise may occur, can be checked.

Subsequently, the bump electrode 124 is formed inside the opening 122 for forming the bump electrode, consisting of the upper part and the lower part. The bump electrode 124 is formed by means of electroplating using the undercoat metal layer 112 as a common electrode on one side, and is made of, for example, Cu, Au, or solder, preferably Cu.

Figure 2B:
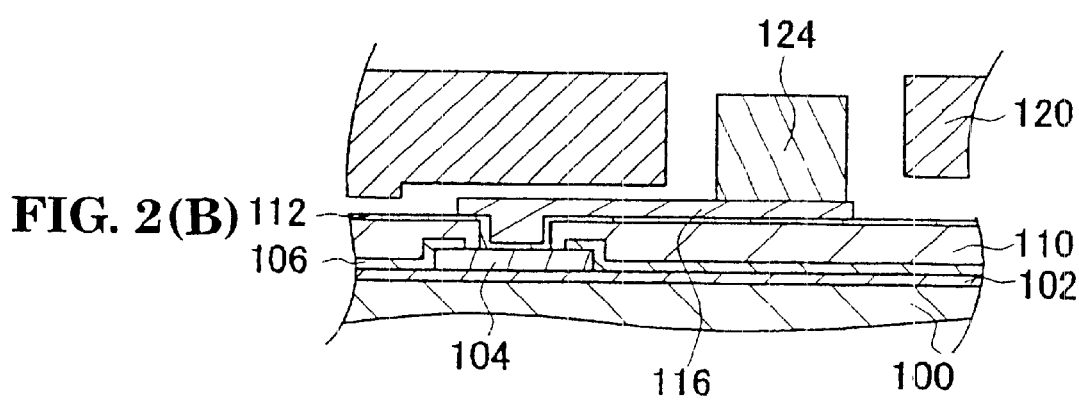
Figure 2C:
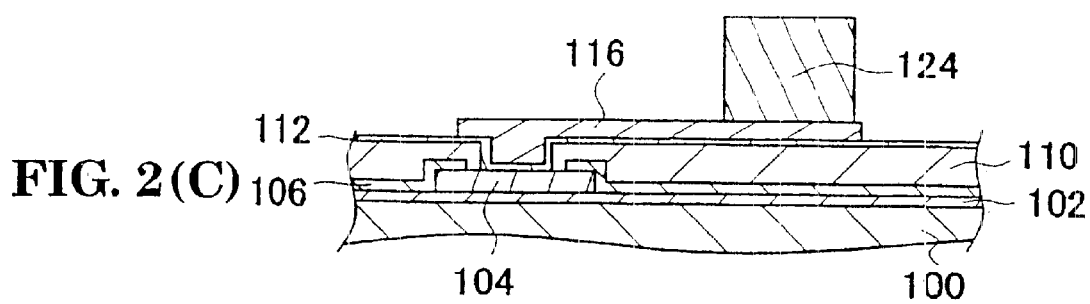

Thereafter, as shown in FIG. 2(B), the liquid photosensitive resin film 118 is selectively removed by use of a removing solvent, for example, a monoethanolamine solvent. Consequently, as shown in FIG. 2(C), the undercoat metal layer 112 and the rewiring layer 116 are separated from the second solid photosensitive resin film 120 with the result that the second solid photosensitive resin film 120 is peeled off and removed. With such a constitution as described, the liquid photosensitive resin film 118 and the second solid photosensitive resin film 120 can be removed simultaneously and with certainty. In consequence, a step of removing the second solid photosensitive resin film 120 can be simplified, and accordingly, even though a structure of the bump electrode 124 is formed by use of the liquid photosensitive resin film 118, a rise in the cost of manufacturing the semiconductor device can be held down.

Figure 2D:
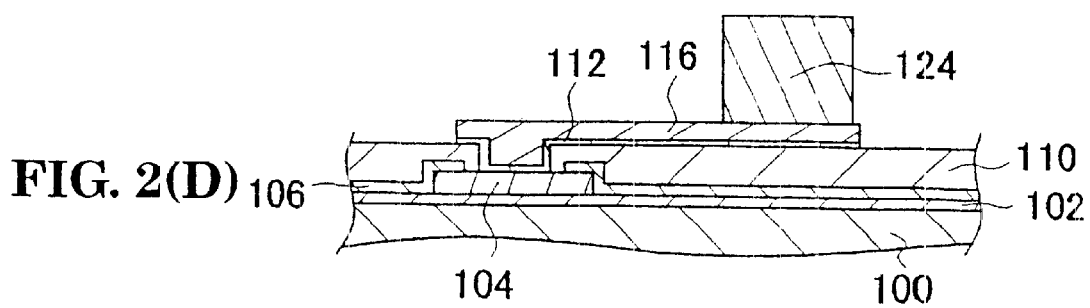

Subsequently, as shown in FIG. 2(D), portions of the undercoat metal layer 112, not covered by the rewiring layer 116 and the bump electrode 124, are removed by etching. Thus, by taking the respective steps described in the foregoing, the structure of the bump electrode 124 is formed on the wafer 100.

Second Embodiment

This embodiment is characterized in that a lower opening 122b for forming a bump electrode is formed in a liquid photosensitive resin film 118 before forming an upper opening 122a for forming the bump electrode in a second solid photosensitive resin film 120. The present embodiment is described in detail hereinafter with reference to FIGS. 1 to 3.

First, the respective steps described in the first embodiment with reference to FIGS. 1(A), 1(B), 1(C), and 1(D) are taken in sequence, thereby forming a rewiring layer 116. Thereafter, steps featuring the present embodiment are taken.

Figure 3A:
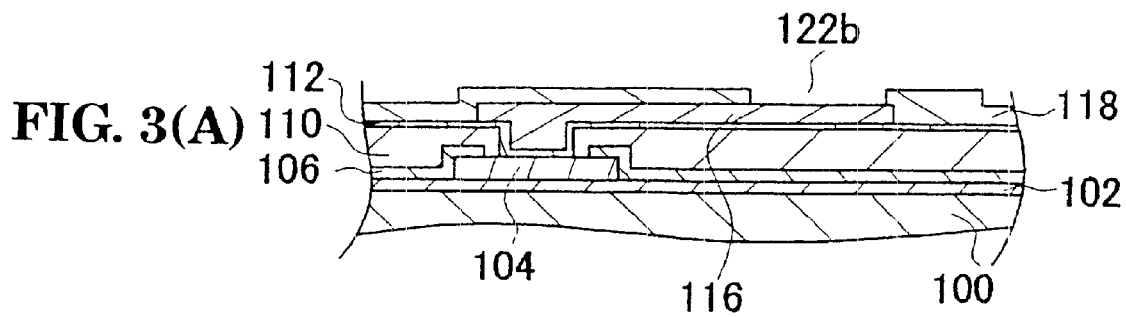
FIGS. 3(A)–3(B) are schematic sectional views of a wafer showing steps of forming a bump electrode in carrying out a second embodiment of a method of manufacturing a semiconductor device according to the invention.

More specifically, as shown in FIG. 3(A), the liquid photosensitive resin film 118 is formed by applying a liquid photosensitive resin to the entire surface of a wafer 100 and applying heat thereto. Thereafter, before sticking the second solid photosensitive resin film 120, the liquid photosensitive resin film 118 is subjected to exposure and development such that the lower opening 122b for forming the bump electrode is formed over a portion of the rewiring layer 116, corresponding to a location where the bump electrode 124 is to be formed, thereby exposing the portion of the rewiring layer 116.

Figure 3B:
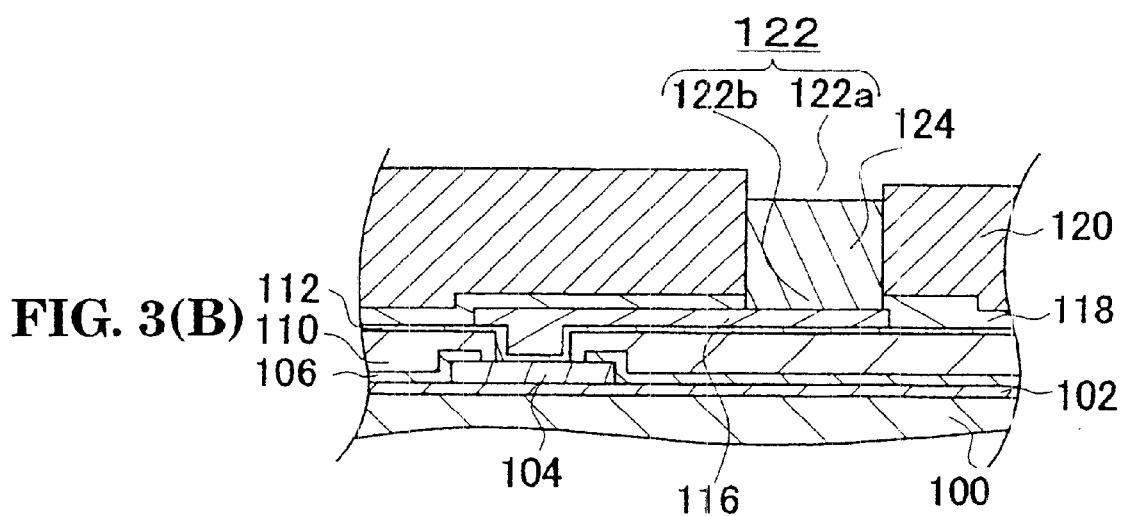

Subsequently, as shown in FIG. 3(B), the second solid photosensitive resin film 120 is stuck to the entire surface of the wafer 100, and is caused to sufficiently adhere to the surface of the liquid photosensitive resin film 118 by applying heat and pressure thereto. Thereafter, the second solid photosensitive resin film 120 is subjected to exposure and development such that the upper opening 122a for forming the bump electrode is selectively formed in a portion of the second solid photosensitive resin film 120, thereby exposing again the portion of the rewiring layer 116. At this point in time, by adjusting a wavelength of exposure light, exposure time, and development time, the upper opening 122a for forming the bump electrode is formed practically at the same location as that for the lower opening 122b for forming the bump electrode, so as to have an internal diameter thereof, practically identical to that of the lower opening 122b for forming the bump electrode.

Subsequently, the bump electrode 124 is formed inside an opening 122 for forming the bump electrode, consisting of the upper opening and the lower opening. Thereafter, the respective steps described in the first embodiment with reference to FIGS. 2(G), 2(H), and 2(I) are taken in sequence, thereby forming a structure of the bump electrode 124.

As described in the foregoing, with the present embodiment, the lower opening 122b for forming the bump electrode is formed in the liquid photosensitive resin film 118 before the upper opening 122a for forming the bump electrode is formed in the second solid photosensitive resin film 120. With such a constitution as described, it becomes possible to prevent deformation from occurring to the lower opening 122b for forming the bump electrode, formed in the liquid photosensitive resin film 118 beforehand, at the time of the exposure and development to which the second solid photosensitive resin film 120 is subjected.

Consequently, the opening 122 for forming the bump electrode, formed in the liquid photosensitive resin film 118, and the second solid photosensitive resin film 120, respectively, will have practically the same internal diameter. As a result, an outer diameter (a width in section) of the bump electrode 124 formed inside the respective openings 122 for forming the bump electrode can be maintained uniformly thicknesswise, so that improvement in quality of the structure of the bump electrode 124 can be attained.

Third Embodiment

This embodiment is characterized in that a rewiring layer 116 is patterned on a liquid photosensitive resin film 114a, and a solid photosensitive resin film 120a is directly stuck onto the liquid photosensitive resin film 114a without removal thereof, thereby forming a bump electrode 124. The present embodiment is described in detail hereinafter with reference to FIGS. 1, 2, and 4.

First, as with the case of the first embodiment described above, the respective steps shown in FIGS. 1(A), and 1(B) are taken in sequence, thereby forming an undercoat metal layer 112. Thereafter, steps featuring the present embodiment are taken.

Figure 4A:
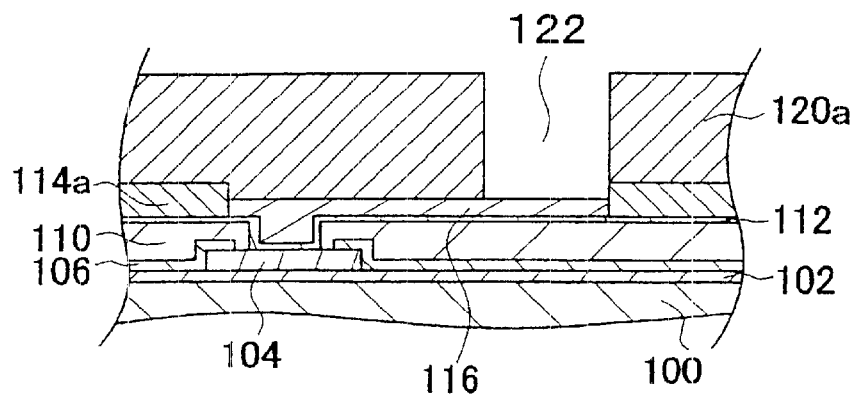
FIGS. 4(A)–4(C) are schematic sectional views of a wafer showing steps of forming a bump electrode in carrying out a third embodiment of a method of manufacturing a semiconductor device according to the invention.

More specifically, as shown in FIG. 4(A), the liquid photosensitive resin film (a first photosensitive resin film) 114a according to the present embodiment is formed by applying a liquid photosensitive resin to the entire surface of a wafer 100 and applying heat thereto. The liquid photosensitive resin film 114a is made of the same material as that for the previously-described liquid photosensitive resin film 118. Thereafter, the liquid photosensitive resin film 114a is subjected to is exposure and development such that an opening 115 for forming a rewiring layer is formed in a region of the liquid photosensitive resin film 114a, extending from a portion thereof, over a metal electrode pad 104, including a thru-hole 108, to a portion thereof, at a location where a bump electrode 124 is to be formed. Subsequently, a rewiring layer 116 is formed inside the opening 115 for forming the rewiring layer. Accordingly, with the present embodiment, the previously-described first solid photosensitive resin film 114 is not used for patterning of the rewiring layer 116.

Subsequently, after the formation of the rewiring layer 116, a solid photosensitive resin film 120a is stuck to the entire surface of the wafer 100 without removing the liquid photosensitive resin film 114a. The solid photosensitive resin film 120a is made of the same material as that for the previously-described second solid photosensitive resin film 120. The solid photosensitive resin film 120a stuck to the entire surface of the wafer 100 is caused to sufficiently adhere to the surface of the liquid photosensitive resin film 114a by applying heat and pressure thereto. Thereafter, the solid photosensitive resin film 120a is subjected to exposure and development, and an opening 122 for forming a bump electrode is formed in a portion of the solid photosensitive resin film 120a, at a location where the bump electrode 124 is to be formed.

Figure 4B:
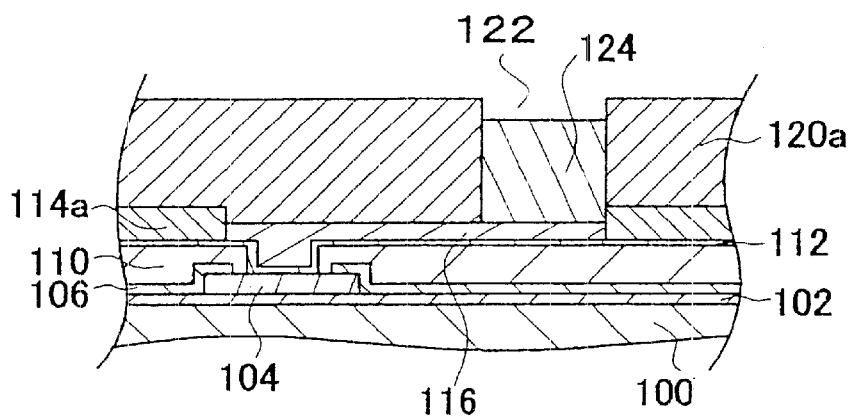

Thereafter, as with the step described hereinbefore with reference to FIG. 2(F), the bump electrode 124 is formed inside the opening 122 for forming the bump electrode as shown in FIG. 4(B).

Figure 4C:
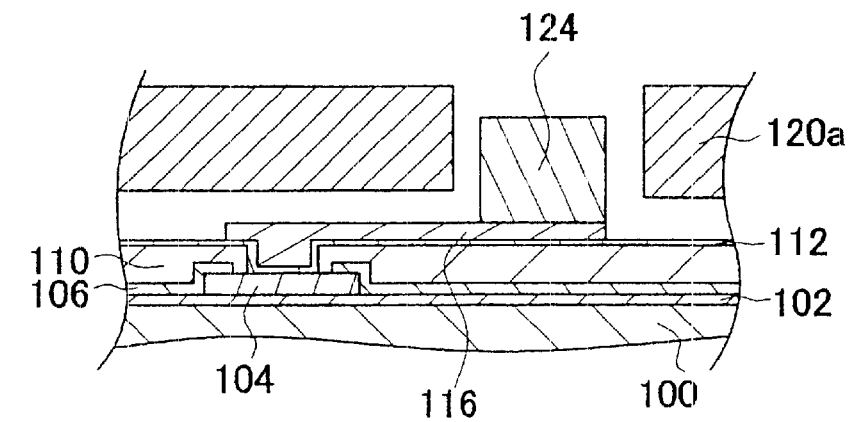
Figure 6A:
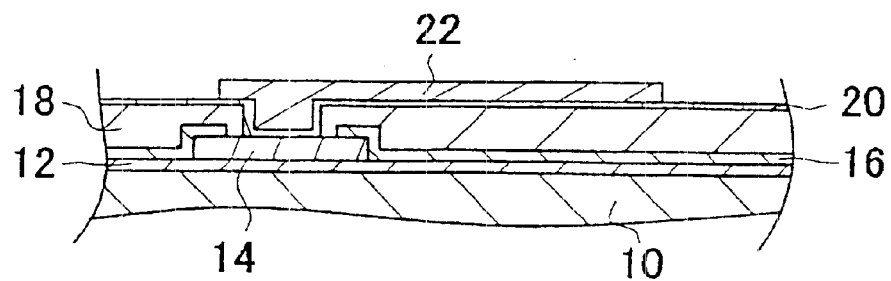
FIGS. 6(A)–6(C) are schematic sectional views of a wafer showing steps of forming a bump electrode in carrying out a conventional method of manufacturing a semiconductor device.
Figure 6B:
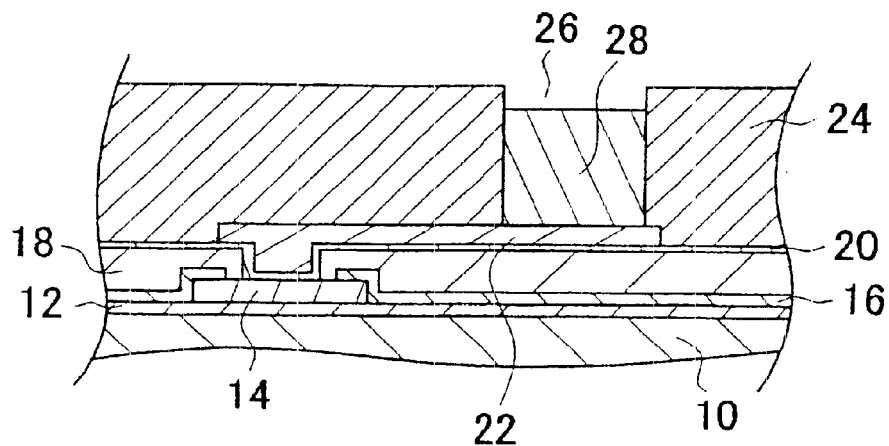
Figure 6C:
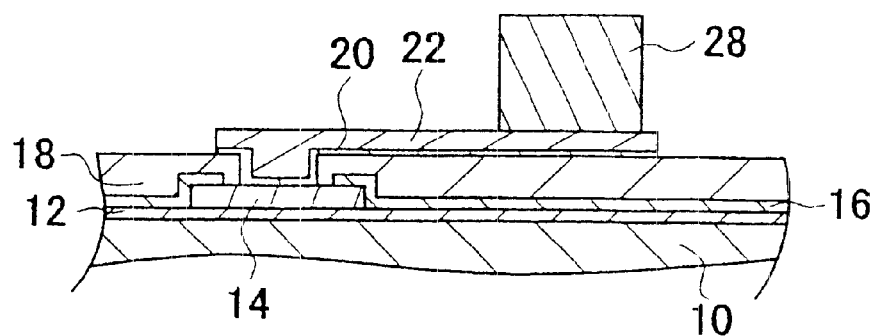

Subsequently, as shown in FIG. 4(C), the liquid photosensitive resin film 114a is selectively removed by use of a removing solvent, for example, a monoethanolamine solvent. Consequently, the undercoat metal layer 112 and the rewiring layer 116 are separated from the solid photosensitive resin film 120a with the result that the solid photosensitive resin film 120a is peeled off. Thereafter, as with the step described in the first embodiment with reference to FIG. 2(H), the solid photosensitive resin film 120a which is peeled off is removed. Further, as with the step described in the first embodiment with reference to FIG. 2(I), portions of the undercoat metal layer 112, not covered by the rewiring layer 116 and the bump electrode 124, are removed, thereby forming a structure of the bump electrode 124 on the wafer 100.

With the present embodiment described above, the solid photosensitive resin film 120a is directly stuck onto the liquid photosensitive resin film 114a before forming the bump electrode 124. Consequently, there is no need of taking a step of removing the liquid photosensitive resin film 114a before sticking the solid photosensitive resin film 120a. Further, with the present embodiment, it is unnecessary to newly form the previously-described liquid photosensitive resin film 118 immediately before sticking the solid photosensitive resin film 120a. As a result, it is possible to simplify a series of the steps for forming the structure of the bump electrode 124, thereby enabling a reduction in the cost of manufacturing.

Furthermore, with the present embodiment, the solid photosensitive resin film 120a is formed on top of the liquid photosensitive resin film 114a covering the undercoat metal layer 112. Consequently, at the time when removing the liquid photosensitive resin film 114a, no portion of the solid photosensitive resin film 120a is left out on the undercoat metal layer 112. Consequently, at the time when removal of unwanted portions of the undercoat metal layer 112 is carried out, complete removal thereof is attained, enabling enhancement in reliability of a semiconductor device.

Still further, with the present embodiment, during the step of removing the liquid photosensitive resin film 114a, the solid photosensitive resin film 120a can be simultaneously peeled off and removed. Accordingly, since there is no need of removing the solid photosensitive resin film 120a by use of a removing solvent, the step of removing can be simplified, thereby enabling a further reduction in the cost of manufacturing.

Fourth Embodiment

This embodiment is characterized by the formation of a rewiring and bump electrode layer 202 comprising a rewiring part 202a, and a bump electrode part 202b integrally formed with the rewiring part 202a. The present embodiment is described hereinafter with reference to FIGS. 1, 4 and 5.

First, as with the case of the first embodiment described above, the respective steps shown in FIGS. 1(A), and 1(B) are taken in sequence, thereby forming an undercoat metal layer 112. Thereafter, steps featuring the present embodiment are taken.

More specifically, as with the case of the step described in the third embodiment with reference to FIG. 4(A), a liquid photosensitive resin film 114a is formed across the surface of a wafer 100, and subsequently, is subjected to exposure and development. By taking such a step, as shown in FIG. 5(A), an opening 115 for forming a rewiring layer is formed in a region of the liquid photosensitive resin film 114a, extending from a predetermined portion thereof, over a metal electrode pad 104, including a thru-hole 108, to a portion thereof, at a location where a bump electrode 122 as described later on is to be formed.

Subsequently, a solid photosensitive resin film 120a is stuck to the entire surface of the wafer 100 without forming the previously-described rewiring layer 116, and heat and pressure are applied thereto, causing the solid photosensitive resin film 120a to adhere to the surface of the as liquid photosensitive resin film 114a. Thereafter, the solid photosensitive resin film 120a is subjected to exposure and development, thereby forming an opening 122 for forming the bump electrode in a portion of the solid photosensitive resin film 120a, at the location where the bump electrode 124 is to be formed. With such a constitution, the opening 115 for forming the wiring layer is connected with the opening 122 for forming the bump electrode, thereby forming an opening 200 for forming the wiring layer integrally with the bump electrode.

Subsequently, as shown in FIG. 5(B), the rewiring and bump electrode layer 202 is formed inside the opening 200 for forming the wiring layer integrally with the bump electrode. The rewiring and bump electrode layer 202 is formed by means of electroplating using the undercoat metal layer 112 as a common electrode on one side, and is made of, for example, Cu, Au, or solder, preferably Cu. Further, the rewiring and bump electrode layer 202 comprises the rewiring part 202a, and the bump electrode part 202b which are formed integrally with each other. The rewiring part 202a has the same function as that for the previously-described rewiring layer 116, and the bump electrode part 202b has the same function as that for the previously-described bump electrode 124. With such a constitution as described, an electrode position is routed from the metal electrode pad 104 to the bump electrode part 202b via the undercoat metal layer 112 and the rewiring part 202a.

Subsequently, as with the case of the step described in the third embodiment with reference to FIG. 4(C), the liquid photosensitive resin film 114a is selectively removed by use of a removing solvent, for example, a monoethanolamine solvent, and simultaneously, the solid photosensitive resin film 120a is peeled off as shown in FIG. 5(C).

Thereafter, as shown in FIG. 5(D), portions of the undercoat metal layer 112, not covered by the rewiring and bump electrode layer 202, are removed by etching, thereby forming a structure of the bump electrode on the wafer 100.

As described in the foregoing, with the present embodiment, the rewiring part 202a and the bump electrode part 202b composing the rewiring and bump electrode layer 202 can be formed simultaneously and integrally with each other. Consequently, steps of the electroplating process can be reduced in comparison with the case of forming the rewiring layer 116 and the bump electrode 124, respectively and independently, so that a process of manufacturing a semiconductor device can be simplified, enabling a reduction in the cost of manufacturing the same. Further, with the present embodiment, as the rewiring part 202a and the bump electrode part 202b are formed integrally with each other, there exists no connecting part therebetween. Consequently, there exists no risk of faulty connection or the like occurring between the rewiring part 202a and the bump electrode part 202b. As a result, reliability of the semiconductor device can be enhanced. In addition, since electric resistance can be checked, it is possible to hold down an increase in power consumption and generation of heat.

Although the preferred embodiments of the invention have been described hereinbefore with reference to the accompanying drawings, it is to be understood that the scope of the invention is not limited to such specific constitutions as described. It is further to be understood that various changes and modifications will be apparent to those skilled in the art without departing from the spirit and scope of the invention as set out in the accompanying claims. Accordingly, such changes and modifications should be considered to be within the scope of the invention.

For example, the constitution wherein the opening for forming the bump electrode is formed in the liquid photosensitive resin film and the second solid photosensitive resin film, respectively, and independently, is described by way of example, however, it will be appreciated that the invention is not limited thereto. The invention may be applied with equal utility to a case where the opening for forming the bump electrode is formed in the first and second photosensitive resin films, respectively, by the same process of exposure and development.

Further, with reference to the above-described embodiments, the constitution wherein the solid photosensitive resin film is peeled off and removed by removal of the liquid photosensitive resin film is described by way of example, however, the invention is not limited thereto.

It will be appreciated that the invention may be carried out with equal utility by dissolving and removing the solid photosensitive resin film by use of a removing solvent, for example, a diethylene glycol monobutyl ether solvent, a potassium hydroxide drug or the like before removal of the liquid photosensitive resin film.

What is claimed is:

1. A method of manufacturing a semiconductor device comprising:
   forming an electrode pad on a semiconductor substrate;
   forming a protective film on the semiconductor substrate so as to expose a portion of the electrode pad;
   forming an undercoat electrically conductive layer electrically connected with the electrode pad on the protection film and the electrode pad;
   forming a wiring layer for electrically connecting the electrode pad with a bump electrode via the undercoat electrically conductive layer over a region of the undercoat electrically conductive layer, extending from a portion thereof, over the electrode pad, to a portion thereof, at a location where the bump electrode is to be formed;
   forming a first photosensitive resin film on the undercoat electrically conductive layer and the wiring layer;
   forming a second photosensitive resin film on top of the first photosensitive resin film;
   subjecting the first photosensitive resin film and the second photosensitive resin film to exposure and development, and forming an opening for forming the bump electrode in a portion of the wiring layer, at the location where the bump electrode is to be formed, so as to expose the portion of the wiring layer;
   forming the bump electrode electrically connected with the wiring layer inside the opening for forming the bump electrode;
   removing the first photosensitive resin film and the second photosensitive resin film after the formation of the bump electrode; and
   removing portions of the undercoat electrically conductive layer, not covered by the, wiring layer, after the removal of the first photosensitive resin film and the second photosensitive resin film, wherein the first photosensitive resin film is made of a first resin and the second photosensitive resin film is made of a second resin, the first resin having weaker adhesion with the undercoat electrically conductive layer than the second resin.

2. The method according to claim 1, wherein the opening for forming the bump electrode comprises an upper opening for forming the bump electrode formed in a portion of the second photosensitive resin film, and a lower opening for forming the bump electrode formed in the first photosensitive resin film so as to be linked with the upper opening for forming the bump electrode, having an internal diameter thereof practically identical to an internal diameter of the upper opening for forming the bump electrode.

3. The method according to claim 1, wherein at the same time when the first photosensitive resin film is removed by use of a removing solvent, the second photosensitive resin film is removed from the undercoat electrically conductive layer and the wiring layer.

4. The method according to claim 1, wherein the first resin has a greater elasticity than that of the second resin, and the first photosensiive resin film is set to have a thickness not less than that of the wiring layer.

5. The method according to claim 1, wherein the undercoat electrically conductive layer is made of a suitable material selected from the group consisting of Au, Cr, Cu, Pd, Pt, Ti, and W.

6. The method according to claim 1, wherein the first photosensitive resin film contains an ethyl Cellsolve acetate resin.

7. The method according to claim 1, wherein the first resin and the second resin have a negative photosensitive property.

8. A method of manufacturing a semiconductor device comprising:
   forming an electrode pad on a semiconductor substrate;
   forming a protection film on the semiconductor substrate so as to expose a portion of the electrode pad;
   forming an undercoat electrically conductive layer electrically connected with electrode pad on the protection film and the electrode pad;
   forming a wiring layer for electrically connecting the electrode pad with a bump electrode via the undercoat electrically conductive layer over a region of the undercoat electrically conductive layer, extending from a portion thereof, over the electrode pad, to a portion thereof, at a location where the bump electrode is to be formed;
   forming a first photosensitive resin film on the undercoat electrically conductive layer and the wiring layer;
   subjecting the first photosensitive resin film to exposure and development, and forming a lower opening for forming the bump electrode in a portion of the wiring layer, at the location where the bump electrode is to be formed, so as to expose the portion of the wiring layer;
   forming a second photosensitive resin film on top of the first photosensitive resin film with the lower opening for forming the bump electrode formed therein;
   subjecting the second photosensitive resin film to exposure and development, and forming an upper opening for forming the bump electrode in a portion thereof, so as to be linked with the lower opening for forming the bump electrode, and to have an internal diameter thereof practically identical to that of the lower opening for forming the bump electrode;
   forming the bump electrode electrically connected with the wiring layer inside the lower opening for forming the bump electrode and the upper opening for forming the bump electrode;
   removing the first photosensitive resin film and the second photosensitive resin film after the formation of the bump electrode; and
   removing portions of the undercoat electrically conductive layer, not covered by the wiring layer, after the removal of the first photosensitive resin film and the second photosensitive resin film, wherein the first photosensitive resin film is made of a first resin and the second photosensitive resin film is made of a second resin, the first resin having weaker adhesion with the undercoat electrically conductive layer than the second resin.

9. The method according to claim 8, wherein the first resin and the second resin have a negative photosensitive property.

10. The method according to claim 8, wherein the undercoat electrically conductive layer is made of a suitable materials selected from the group consisting of Au, Cr, Cu, Pd, Pt, Ti and W.

11. A method of manufacturing a semiconductor device comprising:

forming an electrode pad on a semiconductor substrate;

forming a protective flim on the semiconductor substrate so as to expose a protion of electrode pad;

forming an undercoat electrically conductive layer electrically connected with the electrode pad on the protection film and the electrode pad;

forming a first photosensitive resin film on the undercoat electrically conductive layer;

subjecting the first photosensitive resin film to exposure and development, and forming an opening for forming a wiring layer in a region thereof, extending from a portion thereof, over the electrode pad, to a portion thereof, at a location where the bump electrode is to be formed;

forming a wiring layer for electrically connecting the electrode pad with the bump electrode via the undercoat electrically conductive layer inside the opening for forming the wiring layer;

forming a second photosensitive resin film line on top of the first photosensitive resin film and the wiring layer;

subjecting the second photosensitive resin film to exposure and development, and forming an opening for forming the bump electrode in the second photosensitive resin film, at the location where the bump electrode is to be formed, so as to expose a portion of the wiring layer;

forming the bump electrode electrically connected with the wiring layer inside the opening for forming the bump electrode;

removing the first photosensitive resin film and the second photosensitive resin film after the formation of the bump electrode; and removing portions of the undercoat conductive layer, not covered by the wiring layer, after removal of first photosensitive resin film and the second photosensitive resin film, wherein the first photosensitive resin film is made of a first resin and the second photosensitive resin film is made of a resin, the first resin having weaker adhesion with the undercoat electrically conductive layer than the second resin.

12. The method according to claim 11, wherein the first resin and the second resin have a negative photosensitive property.

13. The method according to claim 11, wherein the undercoat electrically conductive layer is made of a suitable material selected from the group consisting of Au, Cr, Cu, Pd, Pt, Ti and W.

14. The method according to claim 11, wherein the second photosensitive resin film is formed on the first processor resin film and the wiring layer without removing the first photosensitive resin film.

15. A method of manufacturing a semiconductor device comprising:

forming an electrode pad on a semiconductor substrate;

forming a an undercoat electrically conductive layer electrically connected with electrode pad on the protection film and the electrode pad;

forming a first photosensitive resin film on the undercoat electrically conductive layer;

subjecting the first photosensitive resin film to exposure and development, and forming an opening for forming a wiring layer in a region thereof, extending from a portion thereof, over the electrode pad, to a portion thereof, at a location where a bump electrode is to be formed;

forming a second photosensitive resin on top of the first photosensitive resin film provided with the opening for forming the wiring layer, formed therein;

subjecting the second photosensitive resin film to exposure and development, and forming an opening for forming the bump electrode in a portion thereof over the undercoat electrically conductive layer, at the location where the bump electrode is to be formed, so as to expose a portion of the undercoat electrically conductive layer;

forming the wiring layer for electrically connecting the electrode pad with the bump electrode via the undercoat electrically conductive layer inside the opening for forming the wiring layer, with the bump electrode electrically connected with the wiring layer inside the opening for forming the bump electrode, by means of electroplating using the undercoat electrically conductive layer as a common electrode;

removing the first photosensitive resin film and the second photosensitive resin film after the formation of the bump electrode; and removing portions of the undercoat electrically conductive layer, not covered by the wiring layer, after removal of the first photosensitive resin film and the second photosensitive resin film, wherein the first photosensitive resin film is made of a first resin and the second photosensitive resin film is made of a second resin, the first resin having weaker adhesion with the undercoat electrically conductive layer than the second resin.

16. The method according to claim 15, wherein the first resin and the second resin have a negative photsensitive property.

17. The method according to claim 15, wherein the undercoat electrically conductive layer is made of a suitable material selected from the group consisting of Au, Cr, Cu, Pd, Pt, Ti and W.

* * * * *